(12) United States Patent
Pollanen et al.

(10) Patent No.: US 10,892,398 B2
(45) Date of Patent: Jan. 12, 2021

(54) QUBIT HARDWARE FOR ELECTRONS ON HELIUM

(71) Applicants: Johannes Pollanen, Lansing, MI (US); Niyaz Beysengulov, Lansing, MI (US); David Rees, Okayama (JP)

(72) Inventors: Johannes Pollanen, Lansing, MI (US); Niyaz Beysengulov, Lansing, MI (US); David Rees, Okayama (JP)

( * ) Notice: Subject to any disclaimer, the term of this patent is extended or adjusted under 35 U.S.C. 154(b) by 0 days.

(21) Appl. No.: 16/818,508

(22) Filed: Mar. 13, 2020

(65) Prior Publication Data
US 2020/0313063 A1 Oct. 1, 2020

Related U.S. Application Data

(60) Provisional application No. 62/825,466, filed on Mar. 28, 2019.

(51) Int. Cl.
| | |
|---|---|
| H01L 39/22 | (2006.01) |
| G06N 10/00 | (2019.01) |
| H01P 3/123 | (2006.01) |
| H03K 3/38 | (2006.01) |
| H01P 3/06 | (2006.01) |

(52) U.S. Cl.
CPC .......... H01L 39/221 (2013.01); G06N 10/00 (2019.01); H01L 39/228 (2013.01); H01P 3/06 (2013.01); H01P 3/123 (2013.01); H03K 3/38 (2013.01)

(58) Field of Classification Search
CPC ....... H01L 39/221; H01L 39/228; H03K 3/38; H01P 3/06; H01P 3/123; G06N 10/00
See application file for complete search history.

(56) References Cited

U.S. PATENT DOCUMENTS

2008/0086438 A1* 4/2008 Amin ............... G06N 10/00
706/33

OTHER PUBLICATIONS

International Search Report and Written Opinion for International Application No. PCT/US2020/023001, dated Jul. 29, 2020, 19 pages.
Papageorgiou, G. et al., "Counting Individual Electrons on Liquid Helim", Applied Physics Letter, vol. 85, Issue 15 [online], Apr. 5, 2005 [retrieved on Apr. 5, 2020], Retrieved from the internet; <https://arxiv.org/ftp/cond-mat/papers/0405/0405084.pdf><DOI: 10.10631/1.1900301>; the entire document.

(Continued)

*Primary Examiner* — Jung Kim
(74) *Attorney, Agent, or Firm* — Lowenstein Sandler LLP

(57) ABSTRACT

Disclosed is a system and a method to use the system that includes a substrate to support a film of liquid helium and an electron subsystem confined by image forces in a direction perpendicular to the surface of the film, a side gate to electrostatically define a boundary of the electron subsystem, a trap gate to electrostatically define an electron trap located outside the boundary of the electron subsystem, and a load gate to selectively open and close access from the electron subsystem to the electron trap, wherein to open access to the electron trap is to apply a first load gate voltage to the load gate to allow the electrons to access the electron trap, and wherein to close access to the electron trap is to apply a second load gate voltage to the load gate to prevent the electrons from accessing the electron trap.

26 Claims, 9 Drawing Sheets

(56) References Cited

OTHER PUBLICATIONS

Bradbury, F. et al., "Extremely Efficient Clocked Electron Transfer on Superfluid Helium", Dec. 19, 2011, [retrieved on May 15, 2011], Retrieved from the internet: <https://arxiv.org/ftp/arix/papers/1107/1107.4040.pdf><DOI: https?//doi.org/10.1103/PhysRevLett.107.266803>; the enitre document.

Dahm, A., et al., "Using Electrons on Liquid Helim for Quantum Computing", Nov. 5, 2001, [retrieved on May 5, 2020], Retrieved from the internet<https://arxiv.org/abs/quant-ph/011029>; the entire document.

Yang, ete al. "Coupling an Ensemble of Electrons on Suprerfluid Helium to Superconducting Circuit", Physical Review X 6, 2016, pp. 011031-1-011031-7.

\* cited by examiner

QUBIT HARDWARE FOR ELECTRONS ON HELIUM

RELATED APPLICATIONS

This application claims the benefit of U.S. Provisional Application No. 62/825,466, filed Mar. 28, 2019, the entire contents of which is being incorporated herein by reference.

TECHNICAL FIELD

The instant specification generally relates to systems and methods for creating qubit hardware and qubit control and readout mechanisms for quantum computing. More specifically, the instant specification relates to producing qubits by confining, inside electrostatic traps, electrons residing near a surface of liquid helium and to quantum control and readout of such qubits by probing quantum states of the trapped electrons with electromagnetic wave signals.

BACKGROUND

Quantum computing is a technology that utilizes quantum bits (qubits)—quantum systems that can be in a superposition state $\alpha|0\rangle + \beta|1\rangle$ of two quantum states, $|0\rangle$ and $|1\rangle$, with continuously varying parameters $\alpha$ and $\beta$, unlike classical bits which always remain in one of the two classical states, 0 or 1. Operation of a quantum computer may include preparation of a qubit state, quantum entanglement of two or more separate qubits, quantum evolution of the system of entangled qubits in accord with a quantum algorithm (code) tailored to a particular task being solved, quantum readout of the end state of the entangled qubits, and—given the intrinsically probabilistic nature of quantum systems—error-correction mechanisms. Quantum computers can be superior to classical computers for a number of problems (such as prime number factorization) that would not be practicable on classical computers or that would require exponentially-large resources. Despite various proposed realizations of qubits and readout methods, reliable implementation of quantum computing represents an outstanding technological challenge. To be feasible for actual quantum computations, qubits should not have additional degrees of freedom that could affect coherence of quantum states of qubits. At the same time, an external coupling to individual qubits should be possible for the preparation of initial states of qubits and for the readout of their final states. Qubits should be able to retain their quantum coherence for times that are sufficiently long for the initial state preparation, quantum algorithm execution, and the final state readout. The ease and reliability of readout methods remain a significant bottleneck for the ongoing quantum computational efforts. For the aforementioned reasons, development of realistic qubits and readout methods is of significant technological importance.

DESCRIPTION OF DRAWINGS

Aspects and implementations of the present disclosure will be understood more fully from the detailed description given below and from the accompanying drawings of various aspects and implementations of the disclosure, which, however, should not be taken to limit the disclosure to the specific aspects or implementations, but are presented for explanation and understanding purposes only.

DETAILED DESCRIPTION

Aspects of the present disclosure are directed at implementations of qubits based on surface state electrons and the associated readout and control systems and methods for quantum computation. In some instances, surface state electrons may be implemented using electrons residing near a surface of liquid helium and held to the vicinity of such surface by electrostatic image forces of attraction to helium. Electrostatic gates may be used to confine electrons to a bounded area and further to implement electron traps outside the bounded area to trap a small number of electrons therein. The number of electrons trapped in this manner may be controlled by electrostatic gating and, in some implementations, may be equal to one. Such individual electrons may be used as qubits. The quantum states of a qubit, $|0\rangle$ and $|1\rangle$, may be realized, for example, as a ground state and an excited state of an electron in the trap. In some implementations, the quantum states of the qubit may be vertical Rydberg motional states of the electron floating on the surface of liquid helium. In other implementations, the quantum states of the qubit may be due to a quantized lateral motion of the electron inside an engineered electrostatic trap. In yet other implementations, a hybrid double qubit may be formed by coupling the out-of-plane and in-plane motion of the electron in the trap. In these implementations two qubits with large frequency separation are formed from each trapped electron.

Aspects of the present disclosure are also directed at various components (and their assembly) of a system for implementation of quantum computing, such as single-electron qubits, electrostatic traps, and associated microwave control and radio-frequency (RF) control and readout electronics with post processing which uses a classical digital computer. In some implementations, the RF readout of a system containing a qubit or multiple qubits may be performed by preparing an input RF signal having a frequency tuned to an energy difference between the two quantum states of the qubit, transmitting the input signal to a microwave resonator circuit that includes the system containing qubits as a capacitive element, and detecting a response of the microwave resonator circuit. The components described herein may be used for performing single and two-qubit gate operations for universal quantum computation. The system and components described herein, when scaled to multiple qubits (e.g., ~100 qubits), may be used for unique noisy intermediate scale quantum (NISQ) computation. The system and components described herein may be used for further developments in noise reduction, qubit entanglement, and improved qubit coherence for realization of fully fault-tolerant quantum computing platforms.

Figure 1:
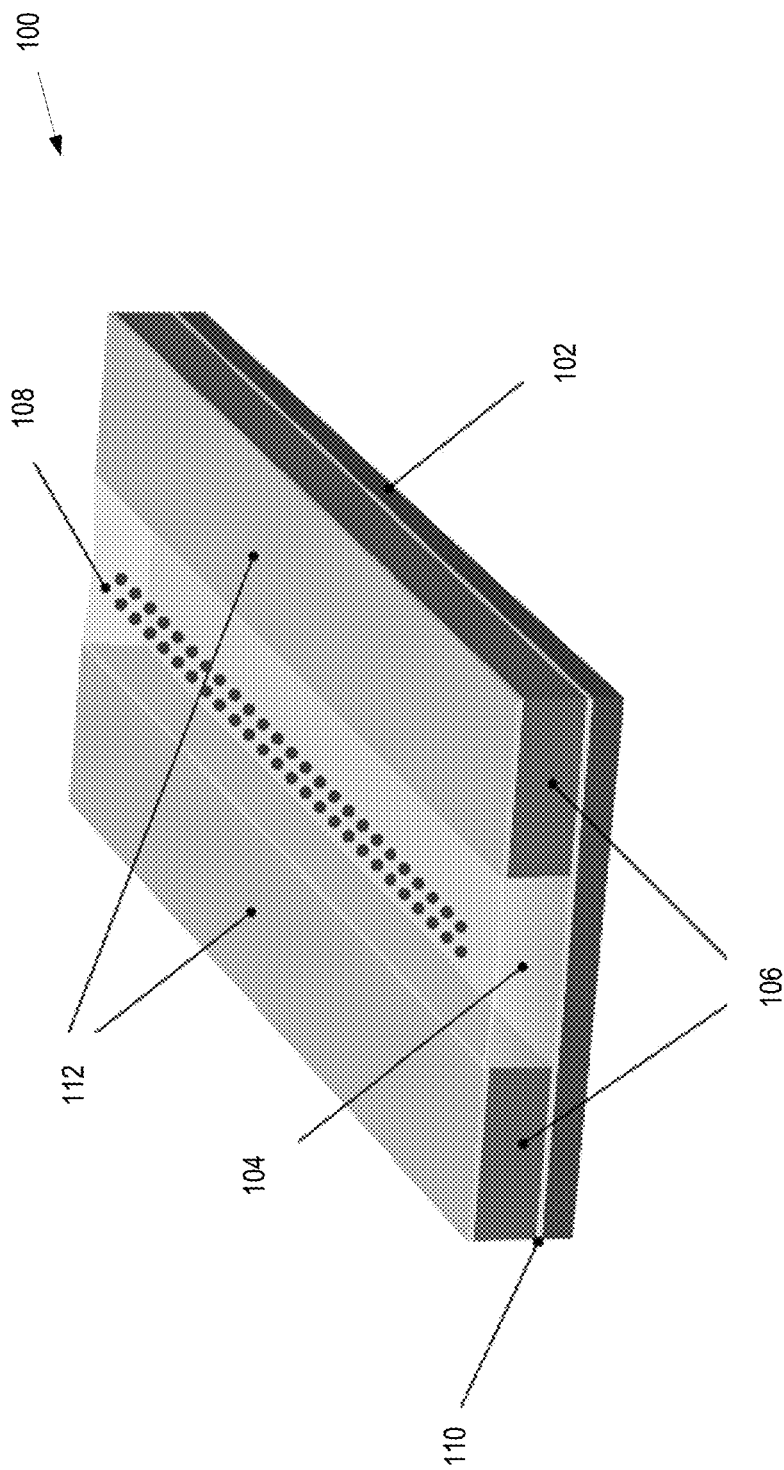
FIG. 1 illustrates schematically an exemplary system that may serve as a reservoir of electrons for qubits and that uses liquid helium and electrostatic gates to facilitate electron confinement, according to one implementation.

FIG. 1 illustrates schematically an exemplary system that may serve as a reservoir of electrons for qubits and that uses liquid helium and electrostatic gates to facilitate electron confinement, according to one implementation. Liquid helium in the system 100 may be supported by a substrate 102. In some implementations, the substrate 102 may be a dielectric, e.g., silicon or sapphire. The substrate 102 may support a film of liquid helium 104. The film of liquid helium may be restricted laterally from escaping the substrate 102 by banks 106. In some implementations, banks 106 may be made of a dielectric material, which may be the same as or different from the material of the substrate 102. For example, the banks may be made of $SiO_x$ or $SiO_2$. The banks may be deposited via thermal evaporation or sputtering. The thickness (height) of the banks 106 may be used to determine the level of liquid film. In some implementations, the banks may have a thickness 0.2-1 µm, although in other implementations the thickness may be below or above this range. In some implementations, the banks 106 may be so positioned as to form a microchannel of liquid helium, as illustrated in FIG. 1. The microchannel (or any other configuration of the helium film 104) may be filled with helium via capillary action using a source of helium (not shown explicitly on FIG. 1). The source of helium may be a low-lying bulk reservoir of helium.

The helium film 104 may serve as a substrate to support electrons 108 floating above the surface of helium. The electrons may be 108 attracted to the surface of helium by long-range image attraction forces, which arise from interaction of the electron charge with the induced polarization of helium. On the other hand, the electrons 108 are repelled by helium atoms at short range. As a result, the electrons 108 may confined near the surface of liquid helium at distances of the order of 50-100 Å from the surface and have a binding energy of the order of 1 meV. The spectrum of the electrons due to image force binding may be of the Rydberg type. A bottom gate (electrode) 110 may be located on top of the substrate 102. The bottom gate 110 may extend over the entire width and length of the system, in some implementations. In other implementations, the bottom gate may underlie only a part of the system. The bottom gate 110 may be made of a conducting material so that when a direct current (dc) voltage signal is applied to the bottom gate 110, the entire bottom gate 110 acquires the same electric potential. In some implementations, the electrons 108 may be initially deposited on the surface of helium by thermionic emission from a filament (e.g., a tungsten filament) located near (e.g., above the helium film). In other implementations, electrons may be produced via field emission or via photoemission. The bottom gate 110 may also be used to control the density of electrons. By varying the potential on the bottom gate 110, an optimal density of the electrons 108 on the surface of helium may be achieved. For example, by decreasing the potential on the bottom gate 110, a fraction of the electrons 108 may be pushed away. Conversely, upon increasing the potential on the bottom gate 110, the system 100 may be capable of keeping more of the electrons 108. At high density of the electrons 108, the electrons 108 may be in a state of Wigner solid with a regular spatial arrangement, as schematically illustrated in FIG. 1. At low densities, the electrons 108 may form an electron liquid state.

Further control over the electrons 108 may be achieved by one or more top gates (electrodes) 112 which may be fabricated on top of the insulating banks 106. The top gate(s) 112 may constrict the motion of the electrons along the surface of liquid helium 104 by means of a lateral electrostatic confinement. For example, by applying a lower (e.g., negative) voltage to a pair of the top gates 112, it may be possible to squeeze the electron channel together in the lateral direction. Conversely, by increasing the voltage applied to the top gates 112, the lateral spread of the electron channel may be increased. To control the lateral spread and motion of the electrons 108 (e.g., along the channel), additional gates (not explicitly shown in FIG. 1) may be used. The top gate 112 (as well as the bottom gate 110 and/or other gates) may be created from a variety of conducting materials. For example, the gates may be made of 5 nm of Ti and 45 nm of Au, in one implementation, but other designs of the gates are possible in other implementations. The gates may be thermally evaporated or sputtered onto the underlying substrate (e.g., a silicon or sapphire) banks 106, as illustrated by way of example in FIG. 1.

The system 100 shown in FIG. 1 may be designed and manufactured in a variety of implementations. Some of the components shown in FIG. 1 may be optional. In some implementations, the system 100 may be mounted inside a cryostat (not shown) to sustain consistently low temperatures. The system 100 in the cryostat may be kept at temperatures below the boiling point of helium, 4.2 K. In some implementations, the system 100 may be kept at temperatures below $^4$He superfluid transition temperature, 2.17 K. In some implementations, the system may be kept at significantly lower temperatures, for example below $^3$He superfluid transition temperature 0.0025 K. In some implementations, cryogen-free $^3$He-$^4$He dilution refrigerator may be used to achieve temperatures below 0.001 K. At such temperatures, spontaneous thermal transitions between different Rydberg electron states of the vertical confinement may be largely frozen out. The surface tension of the liquid helium film 104 may play a stabilizing role and keep the electrons 108 at fixed distances from various additional readout and control electrodes, which may be fabricated within the system (see below). The stability of the surface of helium film 104 may be further controlled by, for example, introducing controlled amounts of the $^3$He isotope, which has a relatively larger viscosity compared with the $^4$He isotope.

Figure 2:
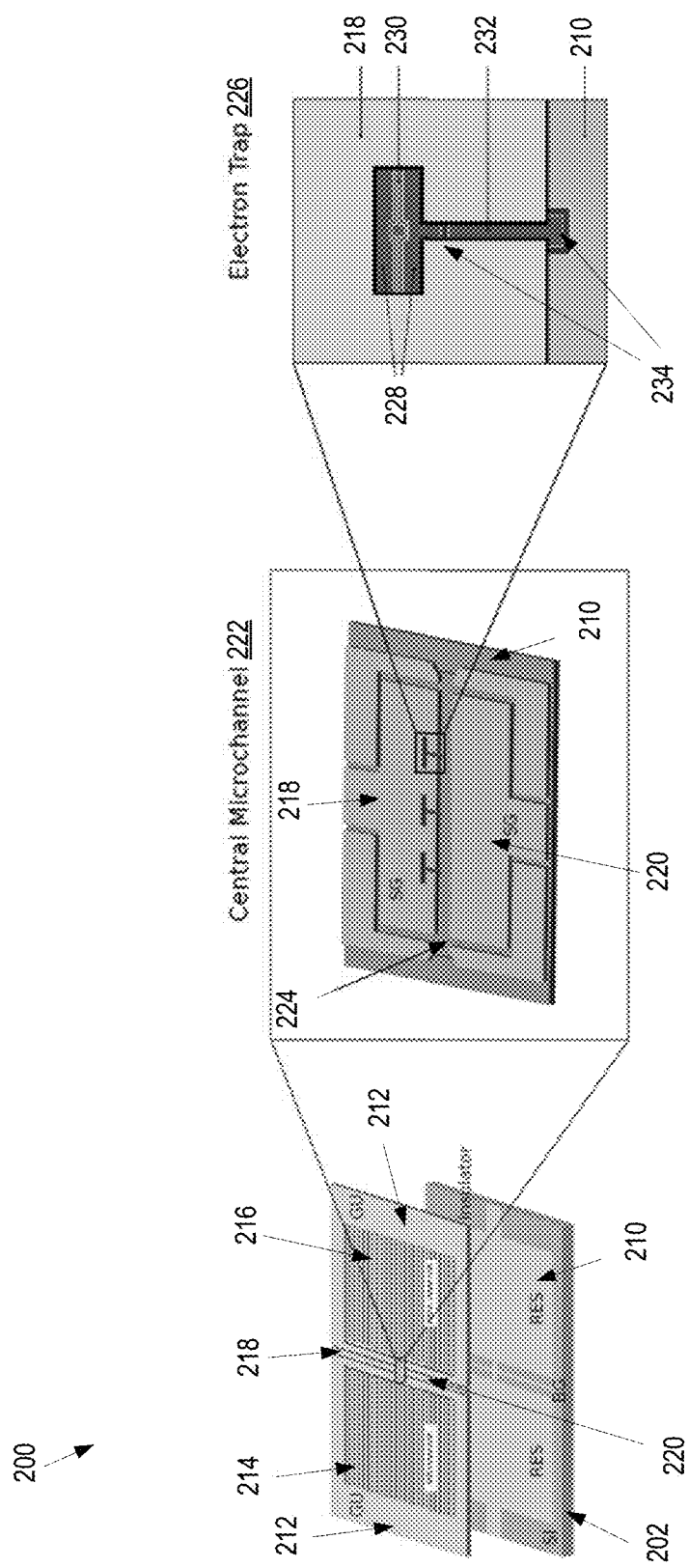
FIG. 2 illustrates schematically an exemplary system that may realize electron traps and that uses liquid helium and electrostatic gates to facilitate electron confinement, according to one implementation.

FIG. 2 illustrates schematically an exemplary system 200 that may realize electron traps and that uses liquid helium and electrostatic gates to facilitate electron confinement, according to one implementation. The system 200 may use some of the concepts illustrated in FIG. 1. Some of the components of the system 200 may correspond to the component of the system 100. In particular, the components denoted by numbers that differ by the first digit (e.g., 1XY and 2XY) may be the same or similar in the two systems. Liquid helium in the system 200 may be supported by a substrate 202. A bottom gate 210 may be deposited on top of the substrate 202. Liquid helium (not shown explicitly) may be placed on top of the substrate 202 and/or the bottom gate 210 and form a film, similar to FIG. 1. The liquid helium film may be supported laterally by a set of (e.g., dielectric) banks similar to the banks 106 of FIG. 1. In some implementations, the banks may partition liquid helium into separate reservoirs. The reservoirs may extend over most of the lateral dimensions of the system 200, in some implementations. In other implementations, the reservoirs may extend only over a part of the system 200. In some implementations, the reservoirs may be broken into a number of parallel microchannels. The liquid helium may support an electron subsystem of the electrons confined in the vertical direction (perpendicular to the surface of helium) by electrostatic image forces, as explained above in relation to FIG. 1. Conducting guard electrodes 212 may be deposited above the insulating banks. In some implementations, the guard electrodes 212 may replicate the map of the underlying insulating banks. In some implementations, the geometry of the guard electrodes 212 may be different from that of the insulating banks. The guard electrodes 212 may be formed by the top gate(s). In some implementations, the guard electrodes 212 may be equipotential. In other implementations, the guard electrodes 112 may consist of a plurality of disconnected elements so that different potentials (voltages) may be applied to their various parts separately.

In a specific realization schematically illustrated in FIG. 2 (left panel) the system 200 has two relatively large regions, the left reservoir 214 and the right reservoir 216, each containing 20-25 microchannel structures. For example, the microchannel structures may have a relatively large length (e.g., ~700 µm, in one implementation). The left reservoir 214 and the right reservoir 216 may define a plurality of electron microchannels, as explained above. The reservoirs 214 and 216 may ultimately serve as the electron reservoirs for loading the electrons into the electron traps. The system 200 may further include a plurality of side gates, such as a side gate 218 and a side gate 220. The side gates 218 and 220 may be electrically isolated from the guard electrodes 212 and from each other. In some implementations, the side gates may be separately biased with different electric potentials. The side gates may define a central microchannel 222 as illustrated by the exploded view of FIG. 2 (central panel). The central microchannel may have a shorter length compared with the dimensions of the reservoirs 214 and 216. In some implementations, the length of the central microchannel 222 may be 100-200 µm. The density of electrons in the central microchannel 216 may be controlled, via capacitive coupling, by the voltage applied to the bottom gate 224 whereas the effective width of electrons, which they occupy in central microchannel 222 may be further controlled with the voltage(s) applied to the side gates 218 and 220. To characterize the properties of the obtained electron subsystem, electric transport measurements (such as low and audio frequency conductivity and compressibility measurements, current-voltage characteristics, measurements to determine electron density, etc.) in combination with finite element simulations may be performed to determine the electrochemical potential $\varphi_e$, the areal electron density ns, and/or other quantities. In some implementations, the transport measurements may be performed by applying a voltage bias between the left and right parts of the reservoir electrode 210 so that the electric current of electrons occurs only across the central microchannel 222. In other implementations, a voltage bias may be applied across the microchannels of the left reservoir 214 (or the right reservoir 216), with the electric current flowing along some or all of the microchannels, depending on the specific geometry of drive electrodes. The drive electrodes may include the guard electrode 212 or separate additional electrodes (not shown explicitly in FIG. 2).

The electrons floating above the surface of helium in the central microchannel 222 may serve as a source of electrons for the electron traps 226 shown in FIG. 2 (blowout view, right panel). The electric field produced by a (voltage-biased) side gate 218 (and side gate 220) may induce one or more boundaries for the electrons 108 in the central microchannel 222. The boundary may delineate the limits for the lateral motion of the electrons 108 floating above the surface of helium in the central microchannel 222. A one or more additional control gates 228 may be located outside this boundary. A positive voltage applied to the control gate(s) 228 may make it energetically favorable for the electrons from the central microchannel 222 to move to the vicinity of the control gate(s) 228. Because the control gate(s) 228 may have an opposite (e.g., positive) voltage compared to the potential on the side gate 218 (e.g., negative), in some implementations it make be advantageous to carve out notches in the side gate 218 to lessen the counteracting effect of the negative side gate potential. In some implementations, a charge sensor may be located inside the electron trap 226. In some implementations the charge sensor may be a quantum charge sensor capable of detecting presence of individual electrons. For example, the charge sensor may be a radio frequency single-electron transistor sensor (RF-SET sensor) 230.

An additional side microchannel leading from the central microchannel 222 to the electron trap 226 may be formed by a load gate 232. The load gate 232 may selectively open and close access from the electrons floating above the surface of liquid helium to the electron trap 226. For example, when a positive potential is applied to the load gate 232, the electrostatic attraction of the electrons to the load gate may open the side microchannel to the electrons from the central microchannel 222 so that the electrons may fill the electron trap 226. When a negative voltage is subsequently applied to the load gate, this negative voltage may severe the side microchannel by building a potential barrier between the central microchannel 222 and the electron trap 226 and trap the electrons inside the latter. In some implementations, the control gate(s) 228, the RF-SET sensor 230, and the load gate 232 may be located below the surface of helium. In some implementations, the control gate(s) 228, the RF SET sensor 230, and the load gate 232 may be located within the plane of the bottom gate 224 while remaining electrically isolated from the bottom gate 224 and from each other by insulating inserts 234, as illustrated in FIG. 2. In other implementations, at least some of the control gate(s) 228, the RF-SET sensor 230, the load gate 232, and the bottom gate 224, and the reservoir electrode 210 may be located in different planes.

Figure 3:
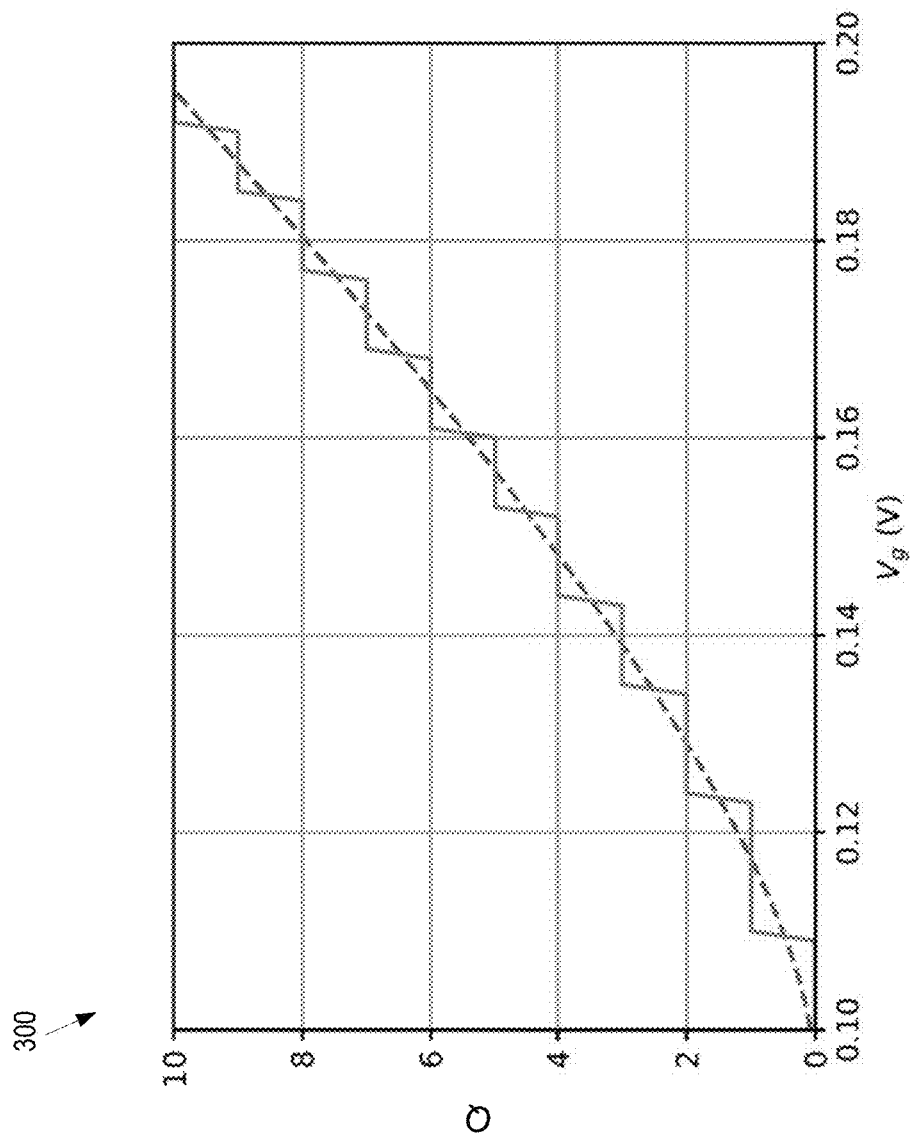
FIG. 3 illustrates schematically an exemplary electron loading protocol for adjusting the number of electrons in an electron trap, according to one implementation.

Once the connection between the central microchannel 222 and the electron trap 226 is severed, the number of electrons trapped inside the electron trap 226 may be adjusted as may be necessary by controlling the voltage $V_g$ applied to the control gate(s) 228. For example, as the gate voltage $V_g$ is decreased, the potential energy of the electrons in the electron trap 226 is increased (as the electron charge is negative). As a result, some electrons may be squeezed from the electron trap 226. This process may be continued until the number of electrons in the electron trap 226 has reached a pre-determined value. In some implementations related to quantum computing, the predetermined value may be equal to one—a situation where a single-electron quantum qubit is realized. FIG. 3 illustrates an exemplary electron loading protocol for adjusting the number of electrons in the electron trap 226. Shown is a dependence 300 of a charge Q inside the electron trap 226 (in units of the electron charge) on the applied control gate 228 voltage $V_g$ for one specific realization of the system 200 and the electron trap 226. The dependence 300 shown in FIG. 3 is calculated using a finite element modeling. The dependence 300 displays characteristic Coulomb blockade electron staircase with sharp transitions between states with n and n+1 electrons that occur at specific values of voltage $V_g$ when the interaction of the electrons with the control gate 228 is sufficient to overcome the change in the Coulomb energy of the electron repulsion inside the electron trap 226. By adjusting voltage $V_g$, as may be indicated by the Coulomb blockade staircase, the number of electrons in the electron trap 226 may be controlled so that a pre-determined number (e.g., one, two, three, and so on) of the electrons remain in the electron trap 226.

In some implementations, the process of loading single electrons into the trapping region may be performed differently, with the severing of the loading microchannel performed subsequently to the adjustment of the number of the electrons inside the trap 226. For example, the loading process may be performed as follows. Initially, the electrostatic potential of the electrons in the electron trap 226 and the loading microchannel may be tuned to be more positive than the electrochemical potential of the electrons in the reservoirs 214 and 216 and the central microchannel 222. Under these conditions, the electrons may move along the loading microchannel into the electron trap 226. The number of electrons loaded into the electron trap 226 may be estimated from the finite element modeling, as described above. Subsequently, the control gate voltage $V_g$ may be swept to negative (or less positive) values. This will decrease the electrostatic potential in the electron trap 226 so that the electrons will be depopulated from the electron trap 226 one by one, as illustrated by FIG. 3. The voltage difference $\Delta V_g$ required to unload one electron from the electron trap 226, according to the finite element modeling calculations, may vary from one to several tens of mV depending on the geometric size and the shape of the electron trap 226 and its electrostatic environment. In addition to mathematical modeling, the electron unloading process may be monitored via the RF-SET sensor 230, as explained in more detail below. Once the number of the electrons in the electron trap 226 has been reduced to one (or another predetermined value), the electrostatic potential along the loading microchannel may be set to negative values by decreasing the voltage on the loading gate 232. In some implementations, the potential inside the loading microchannel may be made significantly more negative compared with the potential inside the electron trap 226 in order to create a sufficiently high potential barrier preventing electron escape from the formed qubit back into the central microchannel 222.

The RF-SET sensor 230 (or any other quantum charge sensor) may be a highly sensitive radio-frequency single-electron transistor micro-fabricated onto an insulating substrate (e.g., the substrate 202) and submerged beneath the liquid helium surface. In some implementations, a high speed quantum charge sensor may be used as the RF-SET to measure the vertical motional quantum state of an electron trapped above it (e.g., inside the electron trap 226). In the full quantum computing system disclosed herein, the RF-SET sensor 230 may facilitate readout of the qubit states. To achieve a high operational speed of the RF-SET sensor 230, in some implementations, a conventional SET may be embedded as the capacitive component of a high-frequency microwave resonant circuit. Modern RF-SET based charge sensors have a demonstrated sensitivity of up $1 \times 10^6$ μC/√Hz and measurement speeds greater than 100 MHz. Such high frequencies are sufficiently fast to readout Bloch sphere oscillations of the qubit and also be high enough to ensure that the low frequency 1/f noise from background charges is negligible to the readout performance of the quantum charge sensor. In some implementations, the charge sensor may be different from the RF-SET-based sensor. For example, the charge sensor may be an offset charge sensitive superconducting qubit, or a similar device capable of detecting individual electron charges.

Electrons trapped inside a finite region (e.g., the electron trap 226) may have a discrete spectrum of energies. In a qubit realization, a ground state of the electron may represent the qubit state $|0\rangle$ whereas one of the excited states, for example, the first excited state, may represent the qubit state $|1\rangle$. In various implementations, the first excited state may correspond to various quantum motions of the electron. For such traps, the first excited state $|1\rangle$ of the qubit may be the first excited Rydberg state for the vertical (i.e., perpendicular to the surface of helium) motion of the trapped electron. This may represent one exemplary implementation of the qubit. In such implementations, the frequency difference between the first excited state $|1\rangle$ of the qubit and its ground state $|0\rangle$ may be about 120 GHz (which corresponds to about 0.5 meV in the energy difference). Conversely, in electron traps whose lateral dimensions are larger than the Bohr radius of Rydberg states, the spacing between the energy levels corresponding to the lateral motion may be smaller than the spacing between the energy levels corresponding to the vertical motion of the trapped electrons. For such traps, the first excited state $|1\rangle$ of the qubit may be the first excited for the lateral motion of the trapped electron (e.g., "particle-in-a-box" quantum motion). This may represent another exemplary implementation of the qubit. Depending on the degree of confinement of the electron in the electron trap 226—which may be controlled via, e.g., the geometry and potentials of the control gates 228—the energy difference between the states of the qubit may be varied greatly between different implementations. For example, in one illustrative and non-limiting implementation, the frequency difference between the first lateral excited state $|1\rangle$ of the qubit and its ground state $|0\rangle$ may be about 10 GHz. A superposition $\alpha|0\rangle + \beta|1\rangle$ of two states of the qubit, with quantum amplitudes α and β, may be prepared and controlled (as discussed in more detail below) using radio frequency or microwave signals by, for example, inducing Rabi oscillations of the amplitudes α and β.

In some implementations, both the vertical motion and the lateral motion of the trapped electrons can be used to implement a two-qubit system using a single electron. In such implementations, a trapped electron may have at least four Eigenstates, such as $|\downarrow 0\rangle$, $|\downarrow 1\rangle$, $|\uparrow 0\rangle$, and $|\uparrow 1\rangle$, where $|\downarrow\rangle$ is a ground state and $|\uparrow\rangle$ is an excited state with respect to the vertical Rydberg motion of the trapped electron, and $|0\rangle$ is a ground state and $|1\rangle$ is an excited state with respect to the lateral motion of the trapped electron. Accordingly, the state $|\downarrow 0\rangle$ is the ground state of the trapped electron with energy $E_0$. The state $|\downarrow 1\rangle$ may have energy $E_0 + E_1$ that is higher by a first energy difference $E_1$ corresponding to the excited state with respect to the lateral motion. The state $|\uparrow 0\rangle$ may have energy $E_0 + E_2$ that is higher by a second energy difference $E_2$ corresponding to the excited state with respect to the vertical motion. Finally, the state $|\uparrow 1\rangle$ may have energy $E_0+E_1+E_2$, corresponding to the exited states with respect to both motions. A state of such a two-qubit system may be a superposition $A|\downarrow 0\rangle+B|\downarrow 1\rangle+C|\uparrow 0\rangle+D|\uparrow 1\rangle$ of the four states, with quantum amplitudes A, B, C, and D that may be prepared and controlled using a plurality of radiofrequency or microwave signals, such as a first signal with frequency $E_1/h$ and a second signal with frequency $E_2/h$.

It should be noted that the quantum state for such implementations of the qubit may have long quantum coherence times sufficient for quantum computation purposes and that in situ positioning of electrons on the surface of liquid helium is feasible. For example, even in implementations where the energy difference between the states of the qubit is as low as 10 GHz—which corresponds to about 0.5 K on the temperature scale—thermal decoherence of the qubit may be negligible at typical temperatures ~10 mK of the modern dilution refrigerators.

It should be noted that a primary difficulty in utilizing the quantized vertical or lateral motion of trapped electrons on helium as qubits is how to implement a sufficiently fast control of qubit dynamics and integration of the readout electronics into qubits in a comprehensive system that would allow single or multiple-qubit gate operations. Aspects of the present disclosure describe such implementations for a complete and cohesive system that may utilize the quantized motion for NISQ or fully fault-tolerant quantum computing.

As described above, an individual qubit (electron) may be placed above the RF-SET sensor 230 located near the electron trap 226 defined by the control gates 228. In other implementations, a similar quantum charge sensor (e.g. an offset charge sensitive superconducting qubit, or similar device) can be used for qubit readout in place of the RF-SET sensor 230. The electrons may be loaded from the central microchannel 222. A single microchannel may support multiple electron traps 226, as illustrated in FIG. 2 (central panel), with each electron trap 226 serving as a separate qubit. In some implementations, individual qubits may be separately controlled. For example, different control gate voltages may be applied to the control gates 228 of different electron traps 226. As a result, the electrons spectra in different traps may not be the same. For example, adjacent traps may be tuned to have different frequencies corresponding to the energy splitting between the two states of a qubit: e.g., 12.0 GHz, 12.1 GHz, 12.2 GHz, and so on. Accordingly, the response of a targeted qubit may be resonantly probed with a specific qubit: the first qubit may be resonantly probed with the driving frequency of 12.0 GHz whereas a signal having the frequency 12.2 GHz will resonantly probe a state of the second qubit, and so on. Correspondingly, a tunable single source of radio frequencies may probe quantum states of various qubits. In other implementations, the control gates 228 may receive the same voltage $V_g$ but the geometry and layout of control gates and/or or the side gate 218 may vary from trap to trap. In some implementations, both the voltages on the control gates 228 as well as the geometry/layout of different traps may vary. In some implementations, the trap layout and voltages on the control gates 228 may be the same but different dc voltages may be applied to RF-SET sensors 230 that are located near (e.g., underneath) the corresponding electron traps 226. Such different RF-SET voltages varying from trap to trap may be used to Stark-tune the resonant frequencies of each qubit individually. In some implementations, individual qubits may be selectively tuned into a resonance with one another to facilitate quantum entanglement of various qubits. Two or more qubits may be entangled in this manner. In some implementations, applied control gate voltages and/or RF-SET voltages may vary with time. For example, such voltages may be varied adiabatically, in order to tune the energies of the electron states in the traps without inducing quantum transitions between the quantum states of the traps. In some implementations, entanglement between different qubits (e.g., between nearest neighbor and next nearest neighbor qubits) may arise from interaction between their charge degrees of freedom. In particular, such interaction may arise from electric dipole-dipole coupling. The parameters (e.g., strength and range) of such coupling may be controlled by electrostatic gating and/or Stark shifting of the qubit energy levels, as disclosed above. In some implementations, long-range entanglement between distant qubits may be achieved by coupling the electrons in the electron traps 226 to an underlying resonator bus (for example, by capacitive coupling). In some implementations, collective charge oscillations of multiple qubits (e.g., plasma oscillations) may be used to establish a long-range coupling and entanglement of distant qubits.

The components disclosed in reference to FIGS. 2 and 3 may be mounted on a single chip. In some implementations, various components may be mounted on separate chips. For example, a first plurality of qubits may be mounted on a first chip while a second plurality of qubits may be mounted on a second chip. In some implementations, the first and/or second plurality of qubits may have a linear spatial arrangement. In some implementations, the first and/or second plurality of qubits may have a planar spatial arrangement.

Figure 4:
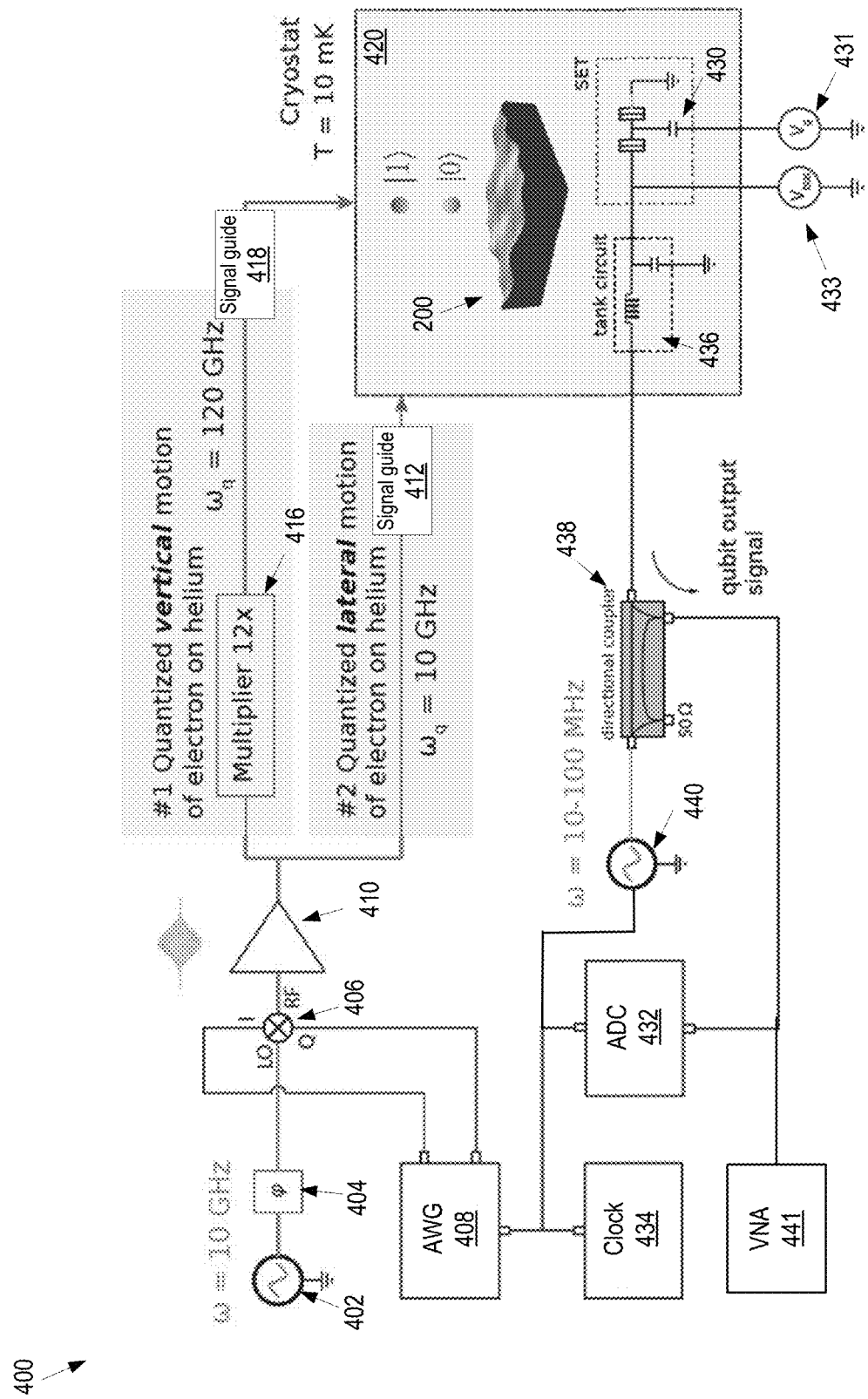
FIG. 4 is a schematic block diagram illustrating an exemplary implementation and components of a system that may implement microwave and radio frequency single electron transistor-based readout and control of qubits.

FIG. 4 is a schematic block diagram illustrating an exemplary implementation and components of a system 400 that may implement microwave and radio frequency single electron transistor-based readout and control of qubits. The system 400 may include a cryostat and an RF circuit to deliver one or more RF signals to the cryostat. The system 400 may include components to prepare RF and microwave signals (e.g., one or more signal generators, mixers, amplifiers, multipliers, and the like), signal guides to deliver the prepared signals to a container (e.g., the cryostat) that contains a microwave resonator circuit coupled (e.g., capacitively) to a system of electron qubits, and components to detect a response of the microwave circuit to the prepared signals (such as RF-SET sensors, tank circuits, directional couplers, analog-to-digital converters, and the like). These elements are exemplary components that may be used for performing electron qubit state preparation and subsequent readout. In some implementations, a qubit preparation may begin with a signal generator 402 generating a continuous-wave radio frequency signal (e.g., a sine signal). The signal generator 402 may be a variable frequency signal generator that produces a time-varying signal tuned to the resonant frequency of the qubit. The signal generator 402 may be an analog synthesizer, a crystal oscillator source, a sufficiently fast digital signal source, and so on. In some implementations, the signal produced by the signal generator 402 may be phase-shifted by a phase shifter 404 to correct for uncontrolled time delays and spurious phase shifts of the transmitted signal during its propagation. To produce controlled one and/or two qubit states with signals generated by the signal generator 402, these control signal may be appropriately shaped. In some implementations, the control signals may be pulse-shaped. These pulsed signals may have accurately controlled duration, phase, and amplitude. In some implementations this may be achieved via single-side band modulation and mixing. For example, the signal may be provided to the local oscillator input of a microwave mixer 406. The mixer 406 may be an IQ-mixer, in some implementations, while in others a 3-port mixer may be used. The mixer 406 may have an LO input coupled to the phase shifter 404 and/or the signal generator 402. The mixer 406 may further have an in-phase input and a quadrature input to receive signals (e.g., pulses) with frequencies (e.g., 10 MHz-1 GHz) that are lower than a qubit resonance frequency, so that when these signals are mixed with the signal generated by the single generator 402, a signal having a frequency at the qubit resonance frequency is obtained. In some implementations, the in-phase input of the mixer 406 may receive a first signal from a waveform generator 408, and the quadrature input of the mixer 406 may receive a second signal from the waveform generator 408. In some implementations, the waveform generator 408 may be an arbitrary waveform generator (AWG) or a field programmable gate array (FPGA) board source. The mixer 406 may mix the local oscillator input with the signals (e.g., phase-stable pulses) produced by the waveform generator (AWG) 408. The mixer output may be one or more radio frequency signals (e.g., pulses) of a predetermined duration, phase and amplitude, as controlled by the generator 408. In some implementations, the signal produced by the signal generator 402 may be a 5-20 GHz signal corresponding to the difference in the lateral-motion energy levels of qubits intended to be controlled and read out. In some implementations, the frequency may be further tuned to the frequency of a specific (e.g., Stark-tuned) qubit (or a plurality of qubits) by the mixer 406, e.g., by using appropriate pulses from the AWG 408. To compensate for spurious losses during signal transmission, the mixed signal may be amplified by an amplifier 410 prior to delivering the signal into the cryostat 420. For example, an amplifier input RF signal may be transformed by the amplifier 410 into a signal of the same frequency but higher amplitude, before outputting the amplified RF signal to the cryostat 420. In some implementations, the prepared and amplified RF output signal may be delivered directly, via a signal guide 412 to the cryostat 420 containing a system of qubits (such as the system 200, in some implementations). The signal guide 412 may be a filtered and tapered waveguide or a coaxial cable, such as a filtered and attenuated coaxial semi-rigid cable. In some implementations, such as where both the lateral and the vertical motion of a trapped electron are used to implement a two-qubit system, both the waveguide and the coaxial cable may be used to deliver signals to the cryostat 420 concurrently. In some implementations, the qubit resonant frequency may be significantly higher than the frequency of the signal output by the mixer 406 (and the amplifier 410). For example, this may be in case where qubits utilize lateral Rydberg states of the vertical motion of the trapped electrons. In such implementations, the signal output by the mixer 406 (and the amplifier 410) may be processed by a frequency multiplier 416 to up-convert the frequency to a target frequency (with the target frequency corresponding to the energy difference between the eigenstates of a qubit). In some implementations, the up-converted frequency may be at least ten times higher the frequency of the signal output by the mixer 406 and/or the amplifier 410. For example, as illustrated by way of example and not of limitations in FIG. 4, a 12× multiplier may up-convert the initial frequency 10 GHz into a 120 GHz signal. The frequency multiplier 416 may be based on standard frequency extender modules, in some implementation. In other implementations, the frequency multiplier may operate using mixer-based up-conversion. The resulting up-converted high frequency signals (e.g., pulses) may then be transmitted to the cryostat 420 through a signal guide 418. The signal guide may be a tapered waveguide. The signal guide 418 may include additional filters to filter out spurious signals than may have been produced during up-conversion or radiated from regions of the system having higher temperature than the sections of the cryostat, which may be held at 10 mK.

In some implementations, only one of the signal guides 412 and 418 may be utilized. For example, when vertical motion of the trapped electron is being used as a qubit, only the signal guide 418 may be used whereas no signal is being transmitted through the signal guide 412. In some implementations, both the high-frequency signals (e.g., 120 GHz signals, as illustrated) and the low-frequency signals (e.g., 10 GHz signals, as illustrated) may be transmitted concurrently through the signal guides 418 and 412, respectively. For example, this may be done if the system of qubits contains qubits of different types—those that use vertical motion of trapped electrons and those that use lateral motion of trapped electrons—and both types of qubits need to be readout (or prepared) at the same time.

The signal (whether up-converted or not) transmitted to the cryostat 420 that may include a system of qubits, may be used to probe a quantum state of one or more qubits. The quantum state of one or more qubits may represent the result of a prior execution of a quantum code by the system of qubits. Upon the completion of the code, the quantum state of the system of qubits may need to be readout for subsequent processing on a conventional (classical) computer. The state of a system of multiple qubits may be an entangled combination of quantum states of individual qubits. To determine the properties of such entangled combination, the system of qubits may be subjected to one or more pulses of microwave radiation (prepared as disclosed above) and the state of the system of qubits at the end of the quantum code execution may be ascertained from a response of the qubits to microwave radiation. In some implementations, such response may include Rabi oscillations—time-dependent evolution of the quantum amplitudes describing a superposition of the quantum states $|1\rangle$ and $|0\rangle$ of the qubit. Such Rabi oscillations, in some implementations, may be measured via the damping and frequency shift of a microwave resonant circuit that includes the RF-SET sensor 430 as a probe of the electron trap 226, as disclosed above (e.g., as RF-SET sensor 230 of the system 200). In some implementations, the RF-SET sensor 430 may have two tunnel junctions connected through a central island, as schematically indicated by the components inside a dashed rectangle SET in FIG. 4. The central island may be made of a metal or a semiconductor. In some implementations, the central island may be made of a superconducting material. In some implementations, the central island may be a quantum dot. The central island of the RF-SET sensor 430 may be capacitively coupled to a gate and a gate voltage 431 may be applied therein. For example, the gate voltage 431 may be used to tune the state of the RF-SET sensor 430 so that a single conduction electron resides on the central island. A bias voltage 433 may further be applied to the RF-SET sensor 430, as illustrated in FIG. 4.

The response detected by the RF-SET 430 may be passed through a sufficiently fast analog-to-digital converter (ADC) 432 where the response may be sampled and digitized. In some implementations, the ADC 432 may be have a speed of ~0.5-6.4 GS/s or higher. Synchronization of the control and measurement scheme may improve operation of qubit systems. For example, synchronization may be facilitated by a master clock 434. Additionally, the signal from the RF-SET 430 can be monitored in either reflection or transmission at the resonant frequency of a resonant circuit 436 using a two-port vector network analyzer (VNA) 441. In one embodiment, the resonant circuit is an LC tank circuit in which an inductor is coupled in series between the RF-SET sensor 430 and a capacitor is coupled in parallel between the RF-SET sensor 430 and ground (or ground potential). The measurement circuit may include additional elements, such as a directional coupler 438 for directing the readout signal from generator 440. In some implementations this coupler can be replaced with a 3-port isolator or a circulator. The signal generator 440 may generate RF signals within a broad range of frequency (10-100 MHz) for interrogation of the tank circuit 436 containing the RF-SET, depending on the specific implementation. The master clock 434 may be coupled to both the ADC 432, the waveform generator 408, and the RF signal source 440 for synchronization of the qubit preparation and readout. In some implementations, the master clock 434 may correlate pulses generated by the signal generator 402 and mixer 406 with the output received by the ADC 432.

With reference to the qubit realization via vertical Rydberg states of trapped electrons, the characteristic time scale for the Rabi oscillations of such qubits may be within the range of ~100 MHz-1 GHz, in some implementations. Given the coherence times known in the art, this may allow for up to more than a hundred quantum gate operations with these qubits. This makes the readout mechanism disclosed herein a viable component of a comprehensive quantum computing system.

In those implementations where the qubits are realized via the quantized lateral motion of electrons within the electronic traps 226, the frequency difference between the ground state $|0\rangle$ and the first excited state $|1\rangle$ of such motion (which is the resonant frequency of the qubit) may be engineered (via the geometry of the trap 226 and its control gates 228) to be of the order of 1-10 GHz. In some implementations, the readout of such lateral motional states of qubits may also be accomplished (in addition to the readout mechanisms disclosed above) by using the RF-SET technology together with microwave circuits similar to the circuits that have been developed for circuit quantum electrodynamic measurements of superconducting circuit-based qubits. The novelty of the concepts disclosed herein with regards to incorporation of such circuit-based implementations is in the use of specific reservoir and trap designs to ensure the formation of well-defined qubit states as well as the integration of these features with the microwave control and the RF-SET readout scheme.

Although the above disclosure with reference to FIG. 4 described the qubit readout techniques, the same techniques may be used for qubit control. More specifically, qubits that are initially in the ground state $|0\rangle$ may be evolved into a desired superposition state $\alpha|0\rangle + \beta|1\rangle$ (as required by a quantum computation code to be implemented on the system of qubits) by inducing the Rabi oscillations in the qubits upon subjecting them to the pulsed microwave signals according to the technique described in relation to FIG. 4.

Figure 5:
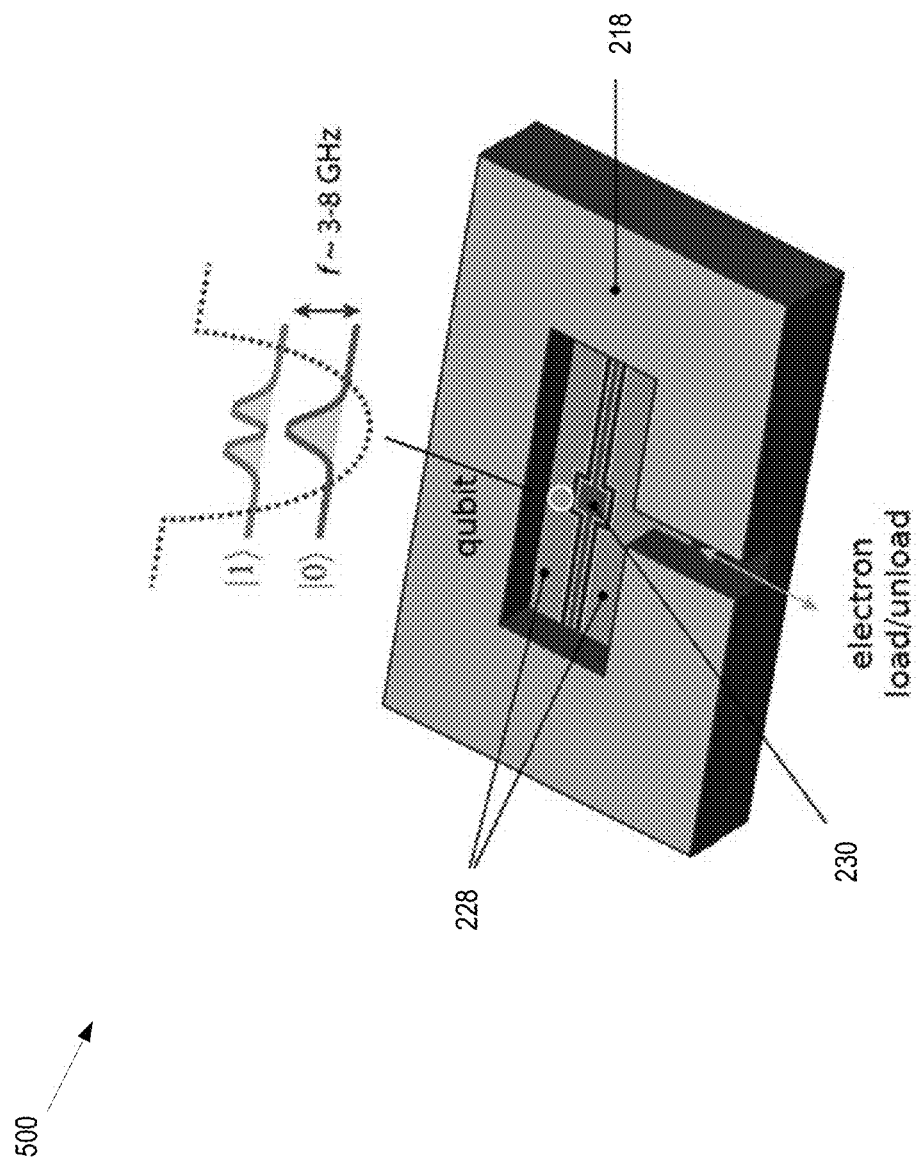
FIG. 5 illustrates schematically an exemplary implementation of an electronic trap for creating a qubit that uses the lateral motion of a trapped electron.
Figure 6:
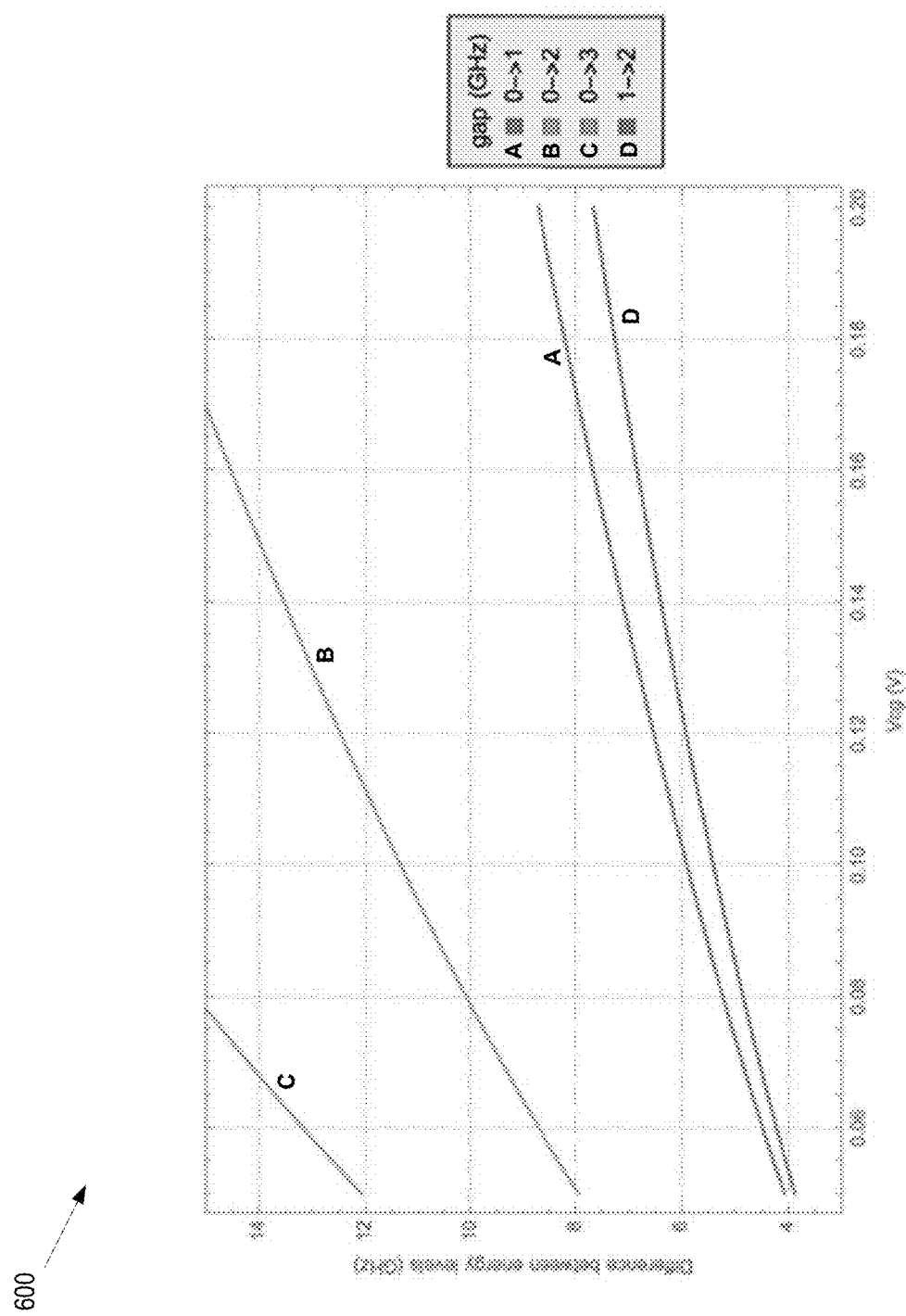
FIG. 6 illustrates an exemplary spectrum of energy levels of an electron in an electronic trap that uses the lateral motion of a trapped electron, in one exemplary implementation of a single-electron qubit.

FIG. 5 illustrates schematically an exemplary implementation 500 of an electronic trap (e.g., electronic trap 226) for creating a qubit that uses the lateral motion of a trapped electron. The electronic trap 500 may have an asymmetric shape; for example, the trap may be 4 μm long and 1 μm wide, in one exemplary non-limiting implementation. The asymmetry of the trap may serve to lift the degeneracy of the excited states corresponding to the lateral motion of the electron and, therefore, to suppress decoherence of the state $|1\rangle$ due to virtual transitions to/from another excited state with a close energy. FIG. 6 illustrates, by way of example, the energy difference between the energy levels of the qubit, $E_n$-$E_m$, as a function of the voltage applied to the control gate 228, in one specific implementation. The energy difference shown in FIG. 6 was calculated by numerically solving Schrodinger's equation for the Eigenstates and Eigen-energies of the motion of the trapped electrons. As indicated by the data 600, the qubit transition frequency for the transition from the ground stat to the first excited state, $|0\rangle \rightarrow |1\rangle$, can be tuned over a wide range—within approximately 4-8 GHz—by changing the potential on the control gate 228.

The qubit implementation illustrated by FIG. 6 displays anharmonicity: the energy (or, equivalently, transition frequency) difference $E_1$-$E_0$ between first excited state and the ground state is different from the difference $E_2$-$E_1$ between the second excited state and the first excited state. For the specific illustrative implementation shown in FIG. 6, the range of such anharmonicity is of the order 0.1-0.4 GHz. In some implementations, such anharmonicities may be advantageous. For example, when the frequency of the readout microwave signals is tuned close to the difference $E_1$-$E_0$, the ensuing Rabi oscillations may be limited to the transitions between the states $|0\rangle$ and $|1\rangle$. Accordingly, the same readout microwave signals would be unlikely to induce transitions between the states $|1\rangle \rightarrow |2\rangle$. This may prevent spurious admixture of the higher excited states $|2\rangle$, $|3\rangle$..., that would result in the qubit decoherence. In some implementations, the degree of anharmonicity may be controlled by the geometry of the electron trap to ensure that qubit excitation into higher excited states is ruled out.

During qubit operations, qubit initialization into the motional ground state $|0\rangle$ may occurs naturally upon populating the microchannels and electron traps with electrons, as disclosed above. This may occur because typical operating temperatures of the system (~10 mK) may be significantly lower than the qubit transition energy, $E_1$-$E_0$. During subsequent qubit control operations (e.g., gate operations), excitation of qubits into states $|1\rangle$ can be achieved by using pulsed microwave fields tuned to the qubit transition frequencies, as described above in relation to FIG. 4.

Figure 7:
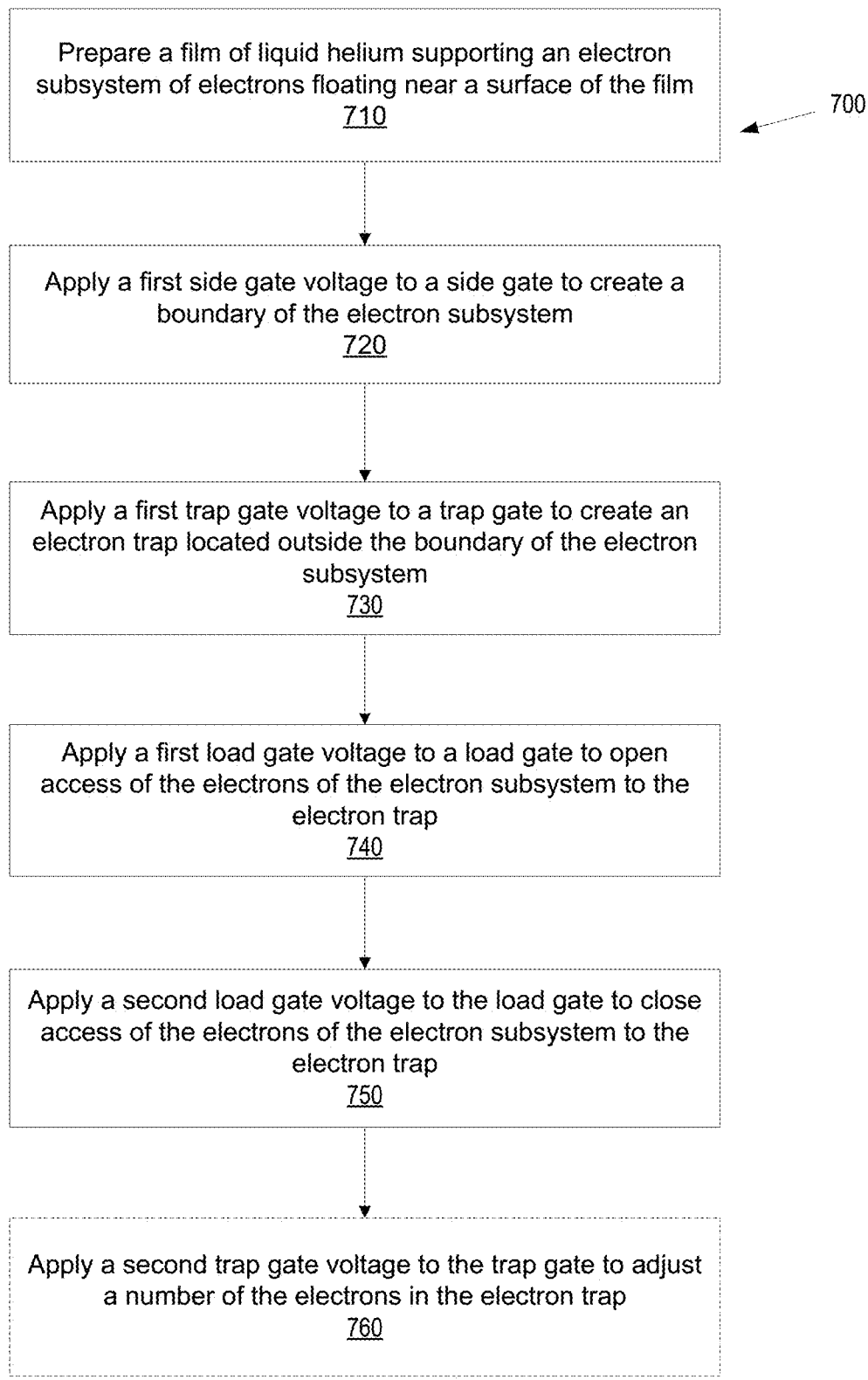
FIG. 7 is a flow diagram illustrating an exemplary implementation of a method to create and populate an electron trap from a subsystem of electrons floating on the surface of a helium film, in one exemplary implementation.

FIG. 7 is a flow diagram illustrating an exemplary implementation of a method 700 to create and populate an electron trap from a subsystem of electrons floating on the surface of a helium film, in one exemplary implementation. In some implementations, method 700 may be performed using systems and components disclosed above in relation to FIGS. 1-6. Method 700 may begin with preparing a film of liquid helium that may support an electron subsystem of electrons floating near a surface of the film (710). For example, method 700 may include preparing a substrate with microchannels that are filled with liquid (e.g., superfluid) helium using capillary action of helium. Preparation of the film may include populating the electron subsystem with electrons from an electron source, e.g., by thermionic emission from the source. Preparation of the film may also include characterization of the electron subsystem, for example, by performing measurements to determine the electrochemical potential of the electron subsystem, the density (e.g., the aerial density of electrons), and/or other quantities of the electron subsystem. Preparation of the film may also include placing various gates near the film of liquid helium. Some of the gates may be electrically isolated from helium and from the electron subsystem but may be capacitively coupled to the latter. Some of the gates may be in a direct electric contact with the helium film Some of the gates may be voltage-biased. Some of the gates may be used to create a boundary of the electron subsystem. Some of the gates may be used to define one or more electron traps outside the boundary, so that the electrons in the electron traps are spatially (e.g., laterally) separated from the rest of the electron subsystem and/or electrons that may reside in other electron traps.

Method 700 may continue with applying a first side gate voltage to a side gate to create a boundary of the electron subsystem (720). In some implementations, the magnitude of the first side gate voltage may be used to control the location and the shape of the boundary. In some implementations, the side gate may have a plurality of electrically connected parts so that a microchannel of liquid helium is formed between the parts of the side gate. In some implementations, the side gate may include a plurality of electrically disconnected parts. Accordingly, the term "a side gate voltage" may include a plurality of voltages applied to different parts of the side gate. Method 700 may continue with applying a first trap gate voltage to a trap gate to create an electron trap located outside the boundary of the electron subsystem (730). The term "trap gate" includes the control gate(s) 228 of FIG. 2. The electron trap may be defined by the electrostatic potential having a maximum at or near the trap location (so that the potential energy of negatively charged trapped electrons may have a minimum there). In some implementations, the trap gate may be a single electrode surrounding the trap, as illustrated in FIG. 5. In some implementations, the trap gate may include a plurality of electrodes, as illustrated in FIG. 2 (right panel) with a plurality of different trap gate voltages applied to different electrodes (e.g., control gates 228). In some implementations, no first trap gate voltage may be applied at all: for example, the electron trap may be defined by a specific shape of the side gate so that a region of an elevated electrostatic potential is formed outside the boundary of the electron subsystem.

Method 700 may continue with applying a first load gate voltage to a load gate to open access of the electrons of the electron subsystem (740). For example, the first load gate voltage may modify the spatial profile of the electrostatic potential in such a way as to allow an access of electrons from the boundary of the electron subsystem to the electron trap (e.g., by forming a microchannel between the two regions). In some implementations, no first load gate voltage may be applied at all: for example, the microchannel may be formed due to a specific shape of the side gate so that a region of an elevated electrostatic potential exists all the way from the boundary of the electron subsystem towards the trap region. Method 700 may continue with applying a second load gate voltage to the load gate to close access of the electrons of the electron subsystem to the electron trap (750). For example, the second load gate voltage may be less positive than the first load gate. Accordingly, the microchannel previously formed between the electron trap and the boundary of the electronic subsystem may be severed so that the electrons are trapped in the electron trap.

Method 700 may continue with applying a second trap gate voltage to the trap gate to adjust a number of the electrons in the electron trap voltage (760). More specifically, after the microchannel to the electron trap is severed, the trap may contain a number of electrons different from a required number of electrons. In some implementations, the second trap gate voltage may be lower than the first trap gate voltage. This may elevate the potential energy of the electrons in the trap and push some of the electrons over the potential barrier back to the electron subsystem. In particular, decreasing the voltage on the trap gate may cause the system to "walk" down the Coulomb blockade staircase (as illustrated by way of example in FIG. 3). The second trap gate voltage may be selected in such a way as to keep a predetermined number of the electrons in the trap, e.g., one, two, three, and so on. In some implementations, to form a single-electron qubit, the second trap gate voltage may be so chosen that only one electron remains in the trap (e.g., corresponding to the step Q=1 of the Coulomb blockade staircase). In some implementations, the required second trap voltage may be known from previous calibration measurements. In some implementations, applying the second trap gate voltage may not be performed at all and the required number of remaining electrons (e.g., Q=1) may be achieved by a proper choice of the first trap gate voltage at block 730 and/or the first side gate voltage at block 720. In some implementations, after the application of the second trap gate voltage and adjusting the number of trapped electrons is performed, a third trap gate voltage may be applied (not shown in FIG. 7). The third trap gate voltage may be higher (e.g., more positive) than the second trap gate voltage, so that the depth of the potential well for the remaining electron(s) in the trap is increased in order to prevent the remaining electron(s) from escaping the trap.

Some of the operations of method 700 may not have to be used every time the method 700 is performed. For example, preparation of the helium film at block 710 may be performed only once for multiple instances of applying gate voltages for electron trapping. In some implementations, as long as the helium film remains stable (or replenished from a reservoir), no additional preparation may be needed.

Figure 8:
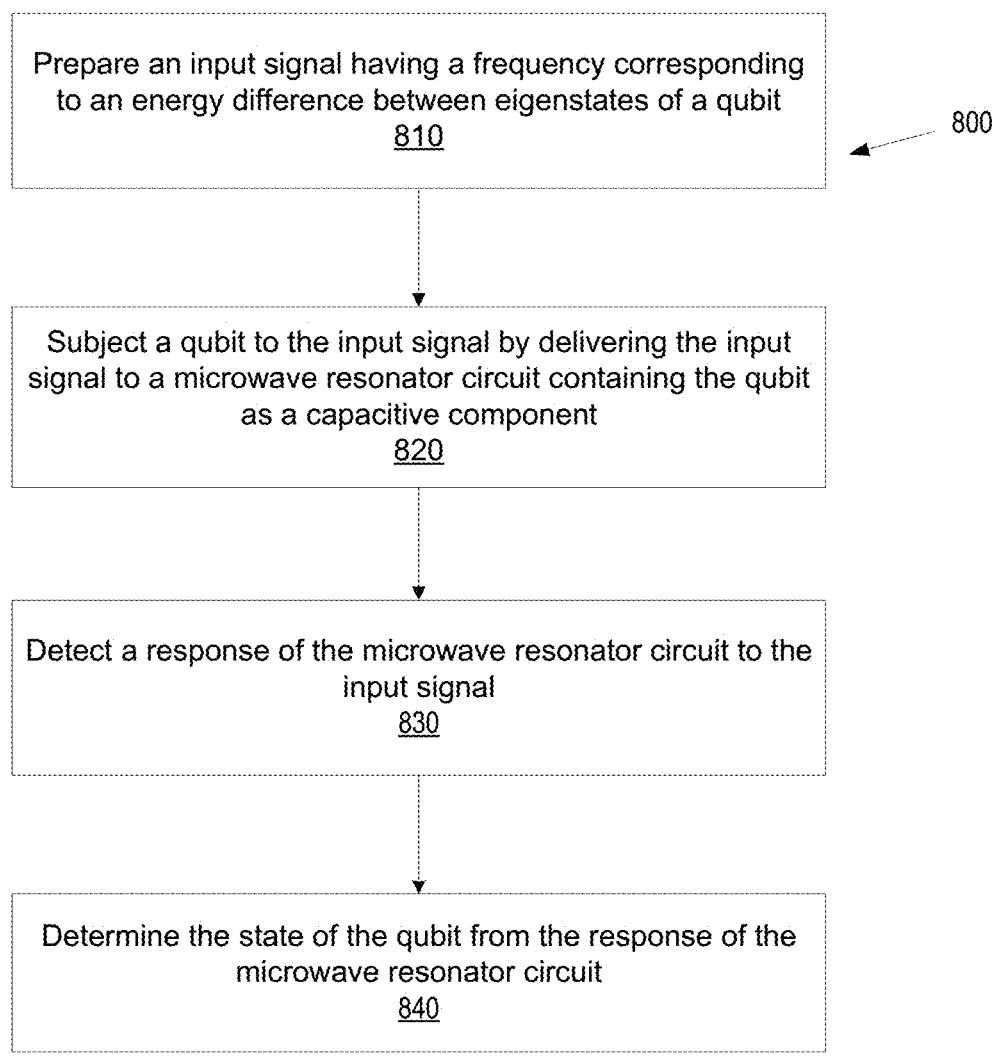
FIG. 8 is a flow diagram illustrating an exemplary implementation of a method to readout, using a radio frequency input signal, a state of a qubit capacitively coupled to a microwave resonator circuit.

FIG. 8 is a flow diagram illustrating an exemplary implementation of a method 800 to read out, using a radio frequency input signal, a state of a qubit capacitively coupled to a microwave resonator circuit. Method 800 may begin with preparing a first input signal having a frequency corresponding to a first energy difference between the Eigenstates of a qubit (810). The Eigenstates of the qubit may correspond to a vertical (perpendicular to the surface of liquid helium) or a lateral (parallel to the surface of liquid helium) motion of the trapped electron. In some implementations, the first input signal may be prepared with some or all of the radio circuitry components 402, 404, 406, 408, 410, 412, 416, 418 shown in FIG. 4. Method 800 may continue with subjecting the qubit to the prepared first input signal by delivering the first input signal to a microwave resonator circuit containing the qubit as a capacitive component (820). Depending on the energy difference between the Eigenstates of the qubit, delivering the first input signal may utilize transmitting the first input signal to a holder of the qubit (e.g., into the cryostat) through a coaxial radio-frequency cable or a tapered waveguide. The qubit may be a part of a microwave resonator circuit. For example, the trapped electron(s) of the qubit may be capacitively coupled to an RF-SET located in the proximity to the trapped electron, as illustrated in FIGS. 2, 4, and 5. The RF-SET may be included in the microwave resonator circuit, as illustrated in FIG. 4, in one exemplary implementation.

Method 800 may continue with detecting a first response of the microwave resonator circuit to the first input signal (830). In some implementations, this may be performed by measuring the impedance response of the microwave resonator circuit—e.g., the frequency shift and the damping of the circuit. Method 800 may continue with determining the state of the qubit from the measured response of the microwave resonator circuit (840). The first response of the microwave resonator circuit may be processed by an analog-to-digital converter and the Rabi oscillations of the qubit may be determined using a subsequent processing on a classical computer. As a result, the state of the qubit(s) that existed prior to the subjecting it to the input microwave signal (e.g., upon completion of a quantum code execution) may be ascertained.

In some implementations, the method 800 may use multiple signals concurrently. For example, while the first input signal may have a frequency corresponding to one of the vertical or a lateral motion of the trapped electron, a second input signal may have a frequency corresponding to the other one of the motions (e.g., lateral or vertical) of the trapped electron. In some implementations, the second input signal may be obtained by the multiplier 416 upconverting an RF signal output by the amplifier 410 and/or mixer 406. Accordingly, two input signals may be prepared at block 810. Similarly, at block 820, the qubit may be subjected to the first input signal and the second input signal concurrently (or at different, e.g., consecutive, times). In some implementations, the first input signal may be delivered to the microwave resonator circuit through a coaxial cable whereas the second input signal may be delivered to the microwave resonator circuit through a waveguide (e.g., a tapered waveguide). At block 830, a second response of the microwave resonator to the second input signal may be detected together with the first response of the microwave resonator to the first input signal. At block 840, determining the state of the qubit may be performed, in some implementations, based on both the first response and the second response. As a result of performing method 800, a four-bit state of the qubit may be determined, such as a state of the qubit that is a superposition of eigenstates $|\downarrow 0\rangle$, $|\downarrow 1\rangle$, $|\uparrow 0\rangle$, and $|\uparrow 1\rangle$.

A method similar to method 800 may be used to prepare a state of the qubit(s) prior to the execution of a quantum code. For example, after populating electron traps (e.g., according to method 700 or some other equivalent method), the corresponding qubits may be in the ground states $|0\rangle$. To prepare superposition states $\alpha|0\rangle + \beta|1\rangle$ (as may be required by a specific quantum computation code to be implemented on the system of qubits), the qubits may be subjected to appropriately prepared microwave signals in order to induce the Rabi oscillations of such amplitude and duration as to drive the qubit(s) into the required superposition states.

A method similar to method 800 may be performed using a plurality of qubits. For example, a device comprising the plurality of qubits and a plurality of control gates can be capacitively coupled to the microwave resonator circuit. Various qubits (and/or) control gates qubits may have a linear spatial arrangement (e.g., to be positioned along the same line) or a planar spatial arrangement. (e.g., may be positioned within the same plane). In some implementations, each of the plurality of qubits may be associated with a respective control gate of the plurality of control gates. In some implementations, in indication that a targeted qubit is to be read out may be received by a processing device (e.g., a computing system). A control voltage may be applied to the respective control gate associated with the targeted qubit to Stark-tune an energy difference between eigenstates of the targeted qubit. The Stark-tuning may be performed so that the energy difference $\Delta_T$ between the eigenstates of the targeted qubit is away from the corresponding differences $\Delta$ of the eigenstate energies of other qubits (e.g., that the quantity $|\Delta_T - \Delta|$ exceeds an inverse (radiative or non-radiative) lifetime of the qubits). The method may continue with preparing an input signal having a frequency corresponding to the energy difference $\Delta_T$, subjecting the device to the input signal by delivering the input signal into the microwave resonator circuit, detecting a response of the microwave resonator circuit to an input signal, and determining the state of the targeted qubit from the response of the microwave resonator circuit.

Methods 700 and 800, as well as other methods that are similar to methods 700 and/or 800, may be performed by processing logic that may include hardware (e.g., circuitry, dedicated logic, programmable logic, microcode, etc.), software, firmware or a combination thereof. Methods 700 and 800 and/or each of its individual functions, routines, subroutines, or operations may be performed by one or more processing units of a classical computer. In certain implementations, methods 700 and 800 may be performed by a single processing thread. Alternatively, methods 700 and 800 may be performed by two or more processing threads, each thread executing one or more individual functions, routines, subroutines, or operations of the method. In an illustrative example, the processing threads implementing methods 700 and 800 may be synchronized. Alternatively, the processing threads implementing methods 700 and 800 may be executed asynchronously with respect to each other. Various steps of the methods 700 and 800 may be performed in a different order compared to the order shown in FIGS. 7 and 8. Some steps may be performed concurrently with other steps.

Figure 9:
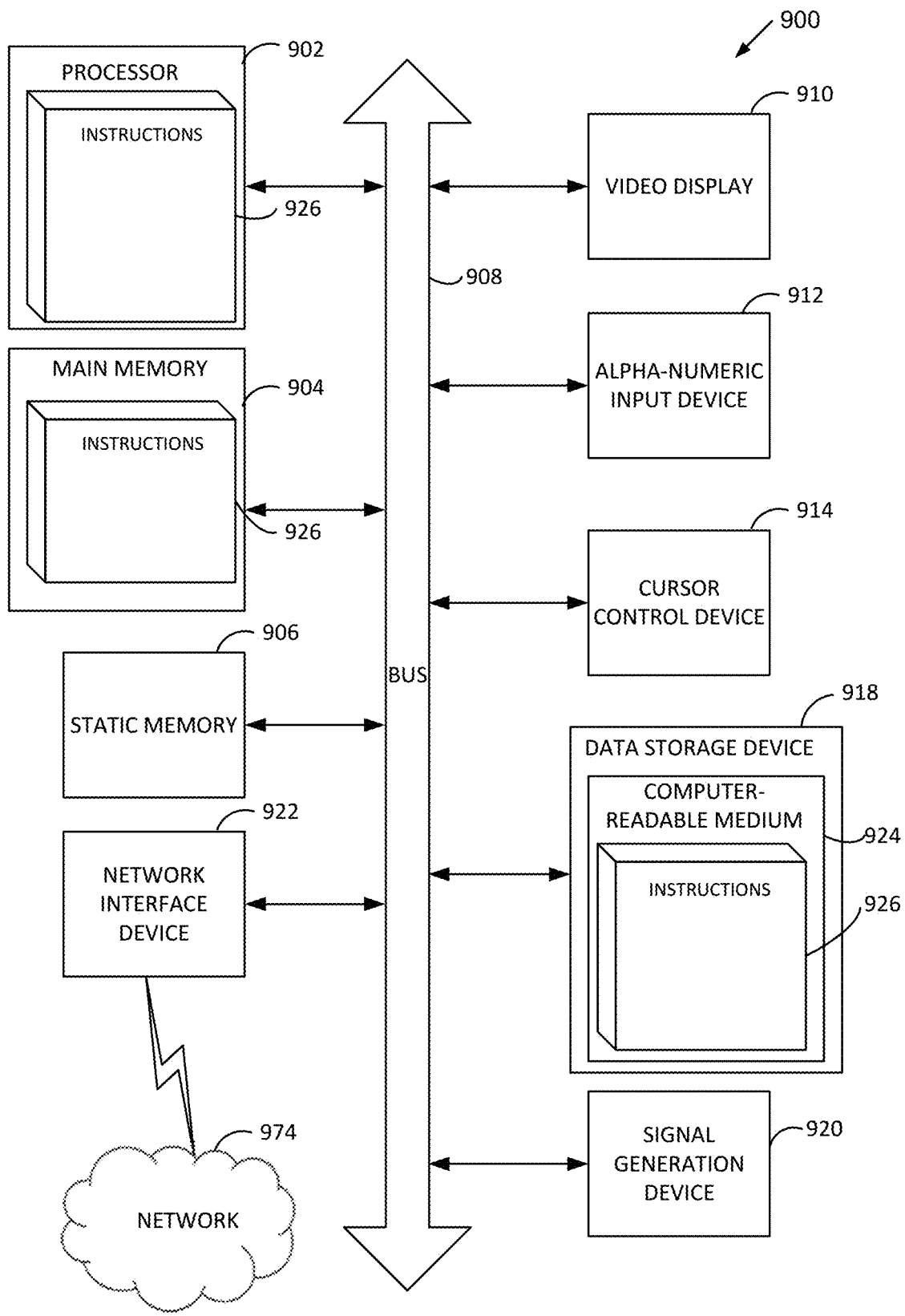
FIG. 9 depicts a block diagram of a classical computer system operating in accordance with one or more aspects of the present disclosure.

FIG. 9 depicts a block diagram of a classical computer system 900 operating in accordance with one or more aspects of the present disclosure. For example, the classical computing system 900 may implement a classical computing code to be used in preparation and control of the initial state of one or more of qubits, in some implementations. The computing system 900 may implement some of the operations illustrated in FIG. 4, in some implementations. The computing system 900 may perform processing of response data received from the microwave resonator circuit and to determine the final states of the qubits that are to be read out. In certain implementations, computer system 900 may be connected (e.g., via a network, such as a Local Area Network (LAN), an intranet, an extranet, or the Internet) to other computer systems. Computer system 900 may operate in the capacity of a server or a client computer in a client-server environment, or as a peer computer in a peer-to-peer or distributed network environment. Computer system 900 may be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 900 may include a processing device 902, a volatile memory 904 (e.g., random access memory (RAM)), a non-volatile memory 906 (e.g., read-only memory (ROM) or electrically-erasable programmable ROM (EEPROM)), and a data storage device 916, which may communicate with each other via a bus 908.

Processing device 902 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 900 may further include a network interface device 922. Computer system 900 also may include a video display unit 910 (e.g., an LCD), an alphanumeric input device 912 (e.g., a keyboard), a cursor control device 914 (e.g., a mouse), and a signal generation device 920.

Data storage device 916 may include a non-transitory computer-readable storage medium 924 which may store instructions 926 encoding any one or more of the methods or functions described herein, including instructions to implement a model of detection of adverse employee relations and potential resignation, in particular, for implementing methods 700 and 800.

Instructions 926 may also reside, completely or partially, within volatile memory 504 and/or within processing device 902 during execution thereof by computer system 500, hence, volatile memory 904 and processing device 902 may also constitute machine-readable storage media.

While computer-readable storage medium 924 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

It should be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

The implementations of methods, hardware, software, firmware or code set forth above may be implemented via instructions or code stored on a machine-accessible, machine readable, computer accessible, or computer readable medium which are executable by a processing element coupled to memory. "Memory" includes any mechanism that provides (i.e., stores and/or transmits) information in a form readable by a machine, such as a computer or electronic system. For example, "memory" includes random-access memory (RAM), such as static RAM (SRAM) or dynamic RAM (DRAM); ROM; magnetic or optical storage medium; flash memory devices; electrical storage devices; optical storage devices; acoustical storage devices, and any type of tangible machine-readable medium suitable for storing or transmitting electronic instructions or information in a form readable by a machine (e.g., a computer).

Reference throughout this specification to "one implementation" or "an implementation" means that a particular feature, structure, or characteristic described in connection with the implementation is included in at least one implementation of the disclosure. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of implementation, embodiment, and/or other exemplarily language does not necessarily refer to the same implementation or the same example, but may refer to different and distinct implementations, as well as potentially the same implementation.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and may not necessarily have an ordinal meaning according to their numerical designation.

What is claimed is:
1. A system comprising:
   a substrate to support a film of liquid helium, wherein the film of liquid helium is to support an electron subsystem comprising electrons that are confined, in a direction perpendicular to a surface of the film of liquid helium, by image forces of electrostatic attraction to the film of liquid helium;
   a side gate to receive a side gate voltage to electrostatically define a boundary of the electron subsystem;

a trap gate to receive a trap voltage to electrostatically define an electron trap located outside the boundary of the electron subsystem; and a load gate to selectively open and close access from the electron subsystem to the electron trap, wherein to open access of the electron subsystem to the electron trap is to apply a first load gate voltage to the load gate to allow the electrons of the electron subsystem to access the electron trap, and wherein to close access of the electron subsystem to the electron trap is to apply a second load gate voltage to the load gate to prevent the electrons of the electron subsystem from accessing the electron trap.

2. The system of claim 1, further comprising a charge sensor capacitively coupled to the electron trap.

3. The system of claim 2, wherein the charge sensor comprises a single-electron transistor.

4. The system of claim 1, further comprising a radio frequency (RF) circuit to generate an RF signal output to a cryostat, wherein the cryostat comprises the substrate, the side gate, the trap gate, and the load gate.

5. The system of claim 4, wherein the RF circuit comprises an amplifier to transform an amplifier input RF signal into the RF signal output to the cryostat.

6. The system of claim 5, wherein the RF circuit further comprises:
a waveform generator to output a first signal and a second signal; and
a mixer to receive a local oscillator input, the first signal and the second signal, wherein the mixer is to output the amplifier input RF signal.

7. The system of claim 6, wherein an in-phase input of the mixer is to receive the first signal and a quadrature input of the mixer is to receive the second signal.

8. The system of claim 5, further comprising a coaxial cable to deliver the RF signal output to the cryostat.

9. The system of claim 4, wherein the RF circuit comprises:
an amplifier to transform an amplifier input RF signal into an amplified RF signal; and
a multiplier to multiply the amplified RF signal to obtain the RF signal output to the cryostat.

10. The system of claim 9, further comprising a waveguide to deliver the RF signal output to the cryostat.

11. The system of claim 10, wherein the waveguide is a tapered waveguide.

12. The system of claim 4, further comprising a charge sensor capacitively coupled to the electron trap and a directional coupler coupled to the charge sensor.

13. The system of claim 12, further comprising:
a resonant circuit coupled between the directional coupler and the charge sensor;
an analog-to-digital converter (ADC) coupled to the directional coupler; and
a clock coupled to the ADC.

14. A method to implement a qubit, the method comprising:
preparing a film of liquid helium, wherein the film of liquid helium is supporting an electron subsystem, wherein the electron subsystem comprises electrons floating near a surface of the film of liquid helium, and wherein the electrons are confined, in a direction perpendicular to the surface of the film of liquid helium, by image forces of electrostatic attraction to the film of liquid helium;

applying a first side gate voltage to a side gate to electrostatically create a boundary of the electron subsystem;

applying a first trap gate voltage to a trap gate to electrostatically create an electron trap located outside the boundary of the electron subsystem;

opening access of the electrons of the electron subsystem to the electron trap by applying a first load gate voltage to a load gate to populate the electron trap; and closing access of the electrons of the electron subsystem to the electron trap by applying a second load gate voltage to the load gate.

15. The method of claim 14, further comprising adjusting a number of the electrons in the electron trap by applying a second trap gate voltage to the electron trap so that a pre-determined number of the electrons remains in the electron trap.

16. The method of claim 15, wherein the pre-determined number of the electrons is one.

17. A method to determine a state of a qubit, the method comprising:
preparing a first input signal having a frequency corresponding to a first energy difference between Eigenstates of the qubit;
subjecting the qubit to the first input signal by delivering the first input signal to a microwave resonator circuit wherein the microwave resonator circuit is capacitively coupled to the qubit;
detecting a first response of the microwave resonator circuit to the first input signal; and
determining the state of the qubit based on the first response of the microwave resonator circuit to the first input signal.

18. The method of claim 17, wherein preparing the first input signal comprises:
generating a first signal having a first frequency;
generating a second signal by mixing the first signal with one or more phase-stable pulses generated by a waveform generator; and
generating the first input signal by up-converting the second signal to a target frequency, wherein the target frequency corresponds to the first energy difference between the Eigenstates of the qubit.

19. The method of claim 18, wherein delivering the first input signal to the microwave resonator circuit comprises transmitting the first input signal through a tapered waveguide.

20. The method of claim 17, wherein delivering the first input signal into the microwave resonator circuit comprises transmitting the first input signal through a coaxial cable.

21. The method of claim 17, wherein the microwave resonator circuit comprises a charge sensor capacitively coupled to the qubit.

22. The method of claim 17, wherein determining the state of the qubit from the first response of the microwave resonator circuit comprises passing the first response of the microwave resonator circuit through an analog-to-digital converter.

23. The method of claim 17, further comprising:
preparing a second input signal having a second frequency corresponding to a second energy difference between Eigenstates of the qubit;
subjecting the qubit to the second input signal wherein the microwave resonator circuit is capacitively coupled to the qubit; and
detecting a second response of the microwave resonator circuit to the second input signal; and wherein determining the state of the qubit is further based on the second response of the microwave resonator circuit to the second input signal.

24. The method claim 23, wherein the second input signal has a frequency at least ten times a frequency of the first input signal, and wherein the first input signal is delivered to the microwave resonator circuit through a coaxial cable and the second input signal is delivered to the microwave resonator circuit through a tapered waveguide.

25. A method to determine a state of a qubit of a plurality of qubits, the method comprising:
  capacitively coupling a device, comprising the plurality of qubits and a plurality of control gates, to a microwave resonator circuit, wherein each of the plurality of qubits is associated with a respective control gate of the plurality of control gates;
  receiving an indication that a targeted qubit is to be read out;
  applying a control voltage to the respective control gate associated with the targeted qubit to Stark-tune an energy difference between Eigenstates of the targeted qubit away from energy differences between Eigenstates of other qubits;
  preparing an input signal having a frequency corresponding to the energy difference between the Eigenstates of the targeted qubit;
  subjecting the device to the input signal by delivering the input signal into the microwave resonator circuit;
  detecting a response of the microwave resonator circuit to an input signal; and
  determining the state of the targeted qubit from the response of the microwave resonator circuit.

26. The method of claim 25, wherein the plurality of qubits have a linear spatial arrangement or a planar spatial arrangement.

* * * * *